US006259384B1

United States Patent
McEwen et al.

(10) Patent No.: US 6,259,384 B1
(45) Date of Patent: *Jul. 10, 2001

(54) HIGH RATE RUNLENGTH LIMITED CODES FOR 10-BIT ECC SYMBOLS

(75) Inventors: Peter McEwen, Santa Clara, CA (US); Kelly Fitzpatrick, Sudbury, MA (US); Bahjat Zafar, Sunnyvale, CA (US)

(73) Assignee: Quantum Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/350,685

(22) Filed: Jul. 9, 1999

(51) Int. Cl.⁷ .......................... H03M 7/00; H03M 13/00; G11B 5/09
(52) U.S. Cl. ............................. 341/59; 341/94; 360/40; 714/701
(58) Field of Search .................... 341/50, 61, 58, 341/59, 94; 360/40, 41, 48, 53; 714/701, 755, 752; 375/240.27, 240, 240.01; 348/384.1, 390.1

(56) References Cited

U.S. PATENT DOCUMENTS

| | | | |
|---|---|---|---|
| 5,136,436 | * 8/1992 | Kahlman ............................... 360/40 |
| 5,260,703 | 11/1993 | Nguyen et al. ......................... 341/100 |
| 5,537,112 | * 7/1996 | Tsang ....................................... 341/59 |
| 5,635,933 | 6/1997 | Fitzpatrick et al. ..................... 341/58 |
| 5,748,119 | * 5/1998 | Ko ........................................... 341/59 |
| 5,757,294 | * 5/1998 | Fisher et al. ............................ 341/57 |
| 5,757,822 | 5/1998 | Fisher et al. ......................... 371/37.1 |
| 5,781,133 | * 7/1998 | Tsang ....................................... 341/59 |
| 5,784,010 | 7/1998 | Coker et al. ............................. 341/61 |
| 6,002,718 | * 12/1999 | Roth ....................................... 375/240 |
| 6,018,304 | * 1/2000 | Bessios ................................... 341/58 |
| 6,072,410 | * 6/2000 | Kim ......................................... 341/81 |

* cited by examiner

*Primary Examiner*—Michael Tokar
*Assistant Examiner*—Daniel D. Chang
(74) *Attorney, Agent, or Firm*—Michael Zarrabian

(57) ABSTRACT

A methodology for designing and implementing high rate RLL codes is optimized for application to 10-bit ECC symbols, and provides rate 30/31, rate 40/41, rate 50/51 and much higher modulation code rates for use in magnetic recording channels. A relatively small subcode encoding—one easy to implement—is applied to a portion of the input stream, and the resulting base codeword is partitioned into nibbles that, in turn, are interleaved among the unencoded ECC symbols. Code constraints on the subcode word nibbles depend upon the values of adjacent unencoded symbols. The resulting codes provide excellent density and error propagation performance.

29 Claims, 4 Drawing Sheets

| A | $y_0$ | B | $y_1$ | C | $y_2$ | E | $y_3$ |
|---|---|---|---|---|---|---|---|
| 10 | 3 | 10 | 3 | 10 | 3 | 10 | 2 |

Rate 50/51 codeword

FIG. 3A

| 30/31 codeword arrangement |||||
|---|---|---|---|
| 10 | 6 | 10 | 5 |

FIG. 3B

| 40/41 codeword arrangement ||||||
|---|---|---|---|---|---|
| 10 | 4 | 10 | 4 | 10 | 3 |

FIG. 3C

| 50/51 codeword arrangement ||||||||
|---|---|---|---|---|---|---|---|
| 10 | 3 | 10 | 3 | 10 | 3 | 10 | 2 |

FIG. 3D

| 80/81 codeword arrangement ||||||||||
|---|---|---|---|---|---|---|---|---|---|
| 10 | 2 | 10 | 3 | 10 | 4 | 10 | 4 | 10 | 4 | 10 | 4 |

FIG. 3E

| 110/111 codeword arrangement ||||||||||||||
|---|---|---|---|---|---|---|---|---|---|---|---|---|---|
| 10 | 3 | 10 | 4 | 10 | 4 | 10 | 4 | 10 | 4 | 10 | 4 | 10 | 4 |

FIG. 5A

Final encoding step:
Let A[0:9], B[0:9], C[0:9] and E[0:9] be the uncoded symbols.
If $x_0$ = 111 and A[9] = 1, then $y_0$ = 000, else $y_0$ = $x_0$
If $x_1$ = 111 and B[9] = 1, then $y_1$ = 000, else $y_1$ = $x_1$
If $x_2$ = 111 and C[9] = 1, then $y_2$ = 000, else $y_2$ = $x_2$
If $x_3$ = 11 and E[9] = 1, then $y_3$ = 00, else $y_3$ = $x_3$

FIG. 5B

First decoding step:
If $y_0$ = 000, then $x_0$ = 111, else $x_0$ = $y_0$
If $y_1$ = 000, then $x_1$ = 111, else $x_1$ = $y_1$
If $y_2$ = 000, then $x_2$ = 111, else $x_2$ = $y_2$
If $y_3$ = 00, then $x_3$ = 11, else $x_3$ = $y_3$

FIG. 6

Final encoding step for the 10/11 code:

If $x_0$ = 111, and $y_3'$[1] = 1, then $y_0$ = 000, else $y_0$ = $x_0$
If $x_1$ = 111, and $y_0$[2] = 1, then $y_1$ = 000, else $y_1$ = $x_1$
If $x_2$ = 111, and $y_1$[2] = 1, then $y_2$ = 000, else $y_2$ = $x_2$
If $x_3$ = 11, and $y_2$[2] = 1, then $y_3$ = 00, else $y_3$ = $x_3$ where $y_3'$[1] is the last bit of the previous codeword.

HIGH RATE RUNLENGTH LIMITED CODES FOR 10-BIT ECC SYMBOLS

TECHNICAL FIELD

The present invention relates to channel modulation codes and methods for implementation in magnetic recording systems such as disk drives. More specifically, the present invention relates to high rate run-length limited (RLL) modulation codes for use in a PRML channel.

BACKGROUND OF THE INVENTION

Modulation codes are used in magnetic recording channels in order to limit recorded bit sequences to those that are most reliably detectable. In particular, run length limited (RLL) modulation codes have been used within partial response signaling, maximum likelihood detection (PRML) data recording and playback channels, decision feedback equalization (DFE) channels, and the like. Partial response systems of interest for magnetic data storage devices such as disk drives and magnetic tape include a PR4 ($1-D^2$) channel and EPR4 ($1+D-D^2-D^3$) channel as well as other nonclassical polynomials. The present invention can be used in any PR channel.

In general, magnetic recording systems employ Viterbi detectors to achieve maximum likelihood detection of user data as it is played back from the recording medium. A modulation code for a PRML data recording and playback channel is selected to balance code efficiency against timing/gain loop reliability and the Viterbi detector path memory, as well as error propagation during decoding.

Run length limited modulation codes are often described using the format "(rate) RLL (d,G/I)" where the "rate" is expressed as a ratio of the number of input bits to be encoded to the number of output bits in the resulting codeword. For example, a rate 8/9 modulation code converts an 8-bit input byte into a 9-bit codeword. Rate 8/9 encoding is well known in the art, as described, for example, in U.S. Pat. No. 4,707,681 and U.S. Pat. No. 5,260,703. Rate 8/9 encoding for PRML data channels also is described in U.S. Pat. No. 5,196,849. As the code rate approaches unity, the code is deemed to be more efficient, in that relatively fewer code characters are required to encode user data values. Thus, a rate 8/9 code is more efficient than a rate 2/3 code.

Similarly, a rate 16/17 code is more efficient than a rate 8/9 code. A rate 16/17 code (=0.941) achieves an approximately 6% increase in recording density over a standard rate 8/9 modulation code. One example of a rate 16/17 modulation code is described in commonly assigned U.S. Pat. No. 5,635,933 incorporated herein by this reference. Another rate 16/17 code is described in U.S. Pat. No. 5,784,010 assigned to IBM.

Early PRML read channels used the well-known rate 8/9 RLL (0,4/4) channel code. In accordance with prior art, this channel code is combined with a $1/(1+D^2)$ modulo 2 precoder to obtain the $\{+1,-1\}$ valued magnetic write-current pattern. On the decoder side, the signal is first equalized to the partial response target and then the $+1/-1$ write-current waveform is maximum-likelihood detected. The write current is then "unprecoded" (or postcoded) with a $1+D^2$ modulo 2 function. This "undoes" the preceding to regenerate a $\{0,1\}$ valued sequence. The data is then RLL decoded for the user. Examples of RLL encoders and decoders are disclosed in the patents identified above.

The rate 8/9 code can be extended to a rate 16/17 code by either bit-wise or byte-wise interleaving unencoded bytes with the encoded sequence. While the G and I constraints will become considerably larger (G=12, I=8 for byte-wise interleaved case), the roughly 6% in increased code rate is often considered worthwhile. Still, the need remains for improvements in recording channel encoding efficiency in order to improve storage capacities in recording systems and lower costs. The codes in this patent application are (0,K) codes. The K constraint is equivalent to the G constraint. The 0 means that consecutive ones are allowed, i.e. there is no restriction on the minimum run length of zeros.

Another limitation of prior art is that virtually all known channel coding schemes are based on 8-bit ECC symbols, as they are historically the de facto standard. We anticipate use of a 10-bit ECC symbol and thus new methods are required to achieve improved density and error propagation performance in the context of 10-bit ECC symbols.

SUMMARY OF THE INVENTION

In view of the foregoing background, a general object of the present invention is to improve the effective areal density of data recorded on a magnetic media.

Another object is to improve recording efficiency by reducing the relative number of non-data bits or "overhead" in the data encoding process.

An object of the invention is to provide very high rate modulation codes having reasonable zero run length limitations for use in magnetic recording and playback systems.

A further object of the invention is to minimize implementation complexity in the context of high rate RLL codes, by providing a relatively small subcode.

A further object is to enable effective RLL encoding of 10-bit symbols for magnetic recording.

A more specific object of the invention is to provide a 50/51 modulation code which limits error propagation in the context of 10-bit ECC symbols.

A further object of the present invention is to provide encoding schemes having improved ratios of data bits to code word length without degrading run length limiting in encoded data.

Another object of the invention is to record data on a magnetic media so as to prevent long strings of no transitions on the magnetic media thereby allowing for reliable timing and gain recovery.

According to one aspect of the invention, methodologies and constraints are disclosed to enable the creation of a variety of high rate channel codes primarily for use in a PRML channel of a magnetic recording and playback system. The new method of designing and implementing a desired code generally includes the following steps:

First, for a desired rate code, selecting a suitable base code (or "subcode"), having a rate n/n+1 where n is a multiple of the ECC symbol size. Examples are rates 10/11, 20/21, 30/31 etc. for a 10-bit ECC symbol size.

Second, encoding one or more of the ECC symbols using the selected base code. Specifically, the number of ECC symbols to be encoded is the number of symbols necessary to provide the number of input bits appropriate to the selected base code. For example, a rate 10/11 base code will require encoding one 10-bit ECC symbol, while a rate 30/31 base code will require encoding three ECC symbols (to encode 30 input bits).

Third, partitioning the codeword produced by the base code into a plurality of m nibbles, where m is the number of unencoded ECC symbols. For example, assume a rate 50/51 RLL code is desired. The base code rate 10/11 is selected, and one ECC symbol is encoded to form the 11-bit subcode word. That subcode word is partitioned into m=4 nibbles as four ECC symbols remain unencoded. In one embodiment, three nibbles have three bits each, while a fourth nibble has two bits. However, other partitions are possible as described later.

The fourth step, which is optional but preferred, entails modifying the subcode nibbles in response to the values of corresponding unencoded symbols that will be positioned adjacent to the xi nibbles in the target codeword. Specifically, the invention forbids all zeros in a subcode nibble if the immediately preceding bit (i.e. the last bit of the preceding unencoded symbol) is a zero. Conversely, we forbid all ones in a subcode nibble if the immediately preceding bit (i.e. the last bit of the preceding unencoded symbol) is a one. These constraints ensure at least one magnetic flux transition per nibble.

Finally, the resulting modified nibbles are interleaved among the unencoded ECC symbols. The order of the unencoded symbols and the order of the subcode nibbles interleaved among them is not limited to any specific predetermined sequence. The resulting codeword can begin with either an unencoded ECC symbol or a subcode nibble. Preferably, each unencoded ECC symbol is separated from the next by a subcode nibble, but the present invention also allows for more than one unencoded symbol between two subcode nibbles.

The foregoing techniques can be applied to design rate 30/31, 40/41, 50/51, 80/81, 110/111 and other similar rate codes for encoding 10-bit symbols. For each code, many different arrangements of the unencoded symbols and encoded nibbles can be used. FIG. 3 shows just one example for each code. The size and arrangements of the nibbles, however, has implications for the maximum length of uninterrupted strings of ones and zeros in the resulting codeword, as further explained later. In general, the nibbles will be similar to one another in length, if not uniform. This arises from, first, designing the base code so as to provide an adequate number of codewords. Second, the base code table is designed so as to be easy to implement. These design criteria will tend to result in codes that have good run length properties and result in nibbles that have about the same size. FIG. 3 shows some examples.

Thus in one preferred embodiment, in a rate 50/51 code, the base code has rate 10/11, the number of the unencoded ECC symbols is m=4, and the length 11 word produced by the base code encoder is divided into 4 nibbles of lengths 3,3,3 and 2. The resulting codeword consists of four unencoded ECC symbols interleaved with the nibbles mentioned above. The codeword arrangement is shown in FIG. 3C. This is just a simple example; there are various ways of mapping the input bits to the codewords within the scope of the present invention. Further illustrations are given later.

The described techniques provide simplicity of implementation along with enviable recording density and error propagation performance. The codes described also allow use of a simple precoder $1/1 \oplus D$ to limit the length of the Nyquist sequence ( . . . 01010101 . . . ) where $\oplus$ denotes modulo-2 addition.

The run length constraints k can be reduced by imposing additional constraints on the base codeword nibbles. For example, additional patterns (besides the all ones and all zeros patterns) can be excluded. And, as noted above, the nibble lengths can be "smoothed" (i.e. variation minimized) to reduce k as well.

The present invention is quite different from other modulation coding schemes. For example, in the rate 24/25 code described in U.S. Pat. No. 5,757,294, one input symbol or byte is encoded, and the resulting codeword is partitioned and interleaved among the unencoded bytes. There, the encoded byte (rate 8/9 base code) was produced by a fixed encoding, i.e. without regard to the unencoded bytes. By contrast, according to the present invention, the nibbles first produced by the base code encoding are then subjected to modification ($x_i \rightarrow y_i$), the fourth step above, depending upon the adjacent unencoded byte (the adjacent bit). Another example of the prior art is the '933 patent, directed to a rate 16/17 encoding scheme that again depends solely on the 16-bit (2 byte) input word, without regard to neighboring (unencoded) data. By considering the states of adjacent unencoded bits, the present invention achieves high code rates and improved performance.

Another aspect of the invention is a high rate run length limited code designed in accordance with the foregoing principles.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 3A–3E are examples of codeword arrangements for various high rate RLL codes.

FIG. 5A lists logic equations for implementing the final encoding step for the 50/51 RLL code.

FIG. 5B lists logic equations for implementing the first decoding step for the rate 50/51 code.

FIG. 6 sets forth rate 10/11 subcode final encoding logic equations.

DETAILED DESCRIPTION OF PREFERRED EMBODIMENT

Figures 1, 2:
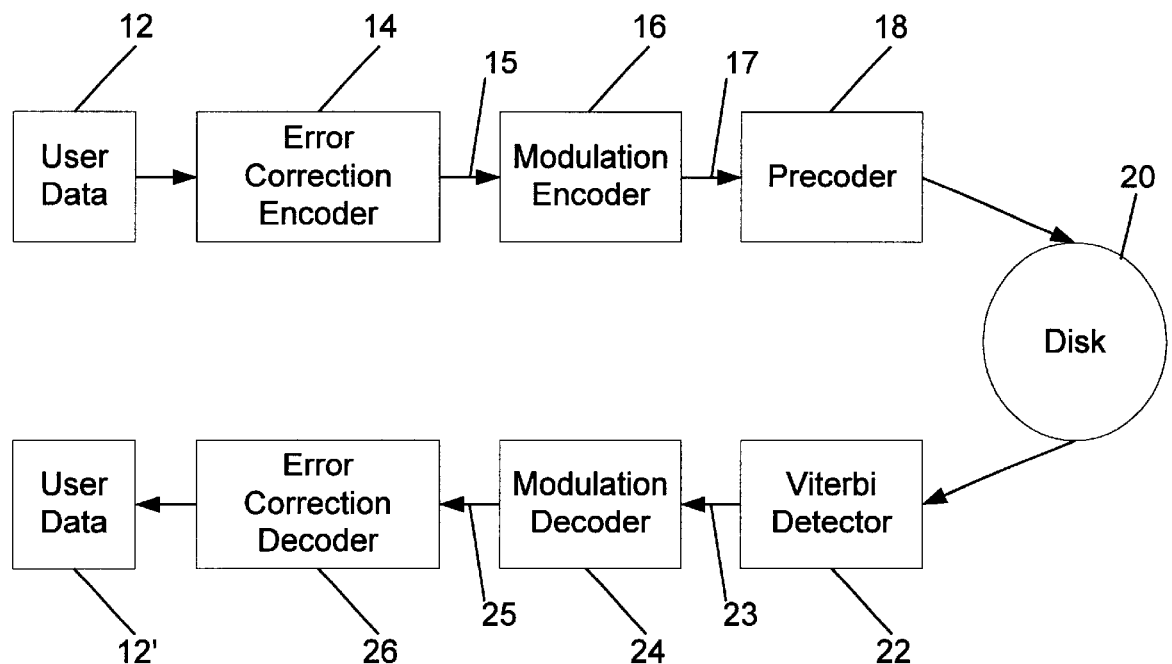
FIG. 1 is a simplified block diagram illustrating data flow in a magnetic data storage device, such as a hard disk drive, employing partial response signaling and maximum likelihood detection.
FIG. 2 illustrates a preferred bit sequence for a rate 50/51 codeword according to the present invention.

FIG. 1 sets forth a simplified block diagram of a magnetic recording and playback system such as a hard disk drive. While a hard disk drive is one application for the present invention, those skilled in the art will appreciate that the principles of this invention may be usefully applied to other devices, such as magnetic tape recording, for example. User data blocks 12 are received from a source, such as a host computer (not shown). The blocks are passed through an error correction encoder 14 which generates and appends ECC remainder bytes to the blocks in accordance with a preestablished ECC polynomial and scheme. The error correction encoder 14 may be conventional, and it is not further described herein. Each data block (now having a predetermined number of ECC bytes appended) then passes through a modulation encoder 16. The modulation encoder 16 is in accordance with principles of the present invention, and it encodes data to form codewords as described in greater detail hereinafter. Each codeword is then passed serially through, for example, a PR4 precoder 18 having a function $1/(1+D^2)$. The precoded codewords are then recorded as sequences of magnetic flux transitions within a data track defined on a storage surface of a magnetic recording disk 20.

During playback, flux transitions induced in a read head element are subjected to analog/digital filter-equalization processes, quantized as digital samples, and applied to a detector 22 implementing a Viterbi algorithm. The playback codeword is then demodulated in a modulation decoder 24 also in accordance with principles of the present invention explained later. Following decoding by the modulation decoder 24, each playback data block is passed through an error correction decoder 26 which checks the playback ECC bytes to locate and correct any correctable error bursts. Error corrected user data 12' is then returned to a requester, such as the host computer (not shown). If the error correction decoder determines that a data block includes uncorrectable errors, an error flag is returned to the requester, and a second attempt is made to read the data block from the disk 20.

A primary goal of the present invention is to devise an encoding or modulation scheme that has the advantages of constrained error propagation while increasing recording density. Importantly, many prior art systems use 8-bit ECC symbols in the recording channel, and the various RLL encoding schemes summarized above assume that symbol size. To improve performance in the future, however, the trend is toward employing 10-bit ECC symbols, and this presents an opportunity to explore new coding schemes. The present invention is directed to leveraging 10-bit ECC symbols in a magnetic channel. Specific examples of embodiments of the invention include codes with rates 30/31, 40/41, 50/51, 80/81, 110/111 summarized in Table 1 below.

The codes of the present invention are characterized by m unencoded ECC symbols together with a base code with rate n/n+1, where n is a multiple of the ECC symbol size (e.g. 10 bits). The length n+1 codeword produced by the base code encoder is divided into m nibbles, each of which contains at least one transition.

For example, in a rate 50/51 code, the base code has rate 10/11, the number of unencoded ECC symbols is m=4 (total 40 bits), and the length 11 word produced by the base code encoder is divided into 4 nibbles of lengths 3,3,3 and 2. Thus the new codeword consists of the unencoded ECC symbols interleaved with the base code nibbles, for a total of 51 bits. One example of the codeword sequence is shown in FIG. 2. However, the base code nibbles can be interleaved arbitrarily among the unencoded ECC symbols in any order, and the codeword can start with either a base code nibble or an ECC symbol. This feature is further explained later.

Base Code Constraints

The coding forbids either the all-ones nibble, or the all-zeros nibble, depending on the value of the bit immediately preceding the nibble in question (i.e. the last bit of the unencoded symbol preceding the nibble). If the bit immediately preceding is zero, the all-zeros nibble is forbidden; and if the preceding bit is a one, the all-ones nibble is forbidden. This ensures at least one transition per base code nibble. Implementation of this constraint is further described below.

For a rate n/n+1 code, there must be at least 2n codewords available. With the constraint described above, there are $2^L-1$ possibilities for each length L nibble, and the number of possible base code codewords is equal to the product of the number of possibilities for each nibble. Thus, with the rate 10/11 base code, the number of possible codewords is $(2^2-1)(2^3-1)^3=3*7^3=1029$ which is greater than $2^{10}=1024$. Thus the proposed 10/11 coding, as constrained, still provides an adequate number of possible codewords.

Now to generalize, let $k_1$ be the maximum allowed number of consecutive zeros or ones; $k_1=E*(\#$ of uninterrupted, i.e., contiguous, unencoded symbols, say n), where E is the length of the ECC symbol (E being 10 for purposes of illustration). Normally, n=1. In that case, and if all nibbles have length L, then $k_1=E+2L-1$. For example, if E=10 and L=5, $k_1$ would be 19 (not a preferred arrangement). The nibbles need not all be of the same length, however. If the nibble lengths vary, then $k_1$ is determined by the two consecutive nibbles whose lengths have the largest sum. Thus, although the nibbles can be arbitrarily interleaved among unencoded ECC symbols, as noted above, the selected order of unequal length nibbles can affect the resulting zero/one run length. Concatenation of codewords (not subcode) must also be taken into consideration in determining the maximum number of zeros or ones; i.e the last nibble and the first nibble should be considered in determining the two consecutive nibbles whose lengths have the largest sum. For the 50/51 code, $k_1=10+(2*3)-1=15$. Note that these codes are RLL (0,k) codes with $k=k_1-1$.

Nyquist Sequence Considerations

The code constraint described above does not per se limit the length of the Nyquist sequence . . . 010101 . . . When a $1/(1\oplus D)$ precoder is used, the maximum length of the Nyquist sequence is limited. Operation of the precoder is defined as follows: if the input at time j is $a_j$, then the output at time j is $b_j=b_{j-1}\oplus a_j$ where $\oplus$ denotes modulo-2 addition. With this precoder, $k_1$ (and thus k) increases by 1 and the maximum length of a Nyquist sequence is $k_1$. Table 1 shows a summary of some of the code constraints that can be obtained using the approach described above. Note that these are merely examples and others can be created from this description.

TABLE 1

EXAMPLES OF HIGH RATE RLL CODES

| Code Rate | k (no precoder) | Base code | Capacity = $\log_2$ (# possible codewords) |
|---|---|---|---|
| 30/31 | 19 | 10/11 | 10.931 |
| 40/41 | 16 | 10/11 | 10.621 |
| 50/51 | 14 | 10/11 | 10.007 |
| 80/81 | 16 | 20/21 | 20.020 |
| 110/111 | 16 | 30/31 | 30.156 |

For each of the code constraints listed in Table 1, one possible codeword arrangement is shown in FIG. 3, viz: FIG. 3A illustrates a rate 30/31 codeword arrangement; FIG. 3B illustrates a rate 40/41 codeword arrangement; FIG. 3C illustrates a rate 50/51 codeword arrangement; FIG. 3D illustrates a rate 80/81 codeword arrangement; and FIG. 3E illustrates a rate 110/111 codeword arrangement. As noted, the unencoded ECC symbols can be arranged in any arbitrary order, as can the subcode nibbles, subject to the discussion above. In other words, there are many ways of mapping the input bits to the codewords.

If capacity is sufficient, the k constraint might be reduced by imposing additional constraints on the nibbles. This can be done by forbidding additional patterns (other than the all-zero and all-one patterns) for one or more of the nibbles. This can also be done by imposing a dependence on the encoding of consecutive nibbles. Since there is excess capacity for the constraints given above, there are many ways of choosing codewords that will be used in the code. In other words, there are many ways of mapping the input bits to the codewords.

Rate 50/51 code

To more fully illustrate the principles of the invention, and how to implement it, we now describe one particular embodiment—the 50/51 code—in detail. Two illustrative codeword arrangements for the 50/51 code are shown below in Table 2:

TABLE 2

ARRANGEMENTS OF 50/51 CODEWORD

| 10 | 3 | 10 | 3 | 10 | 3 | 10 | 2 |
|---|---|---|---|---|---|---|---|
| A | $y_0$ | B | $y_1$ | C | $y_2$ | E | $y_3$ |
| B | $z_1$ | C | $z_0$ | A | $z_3$ | D | $z_2$ |

In Table 2 above, the first row shows the number of bits (total 51) and the second row illustrates one example of mapping the input ECC symbols, consisting of five 10-bit ECC symbols A B C D E, to the codeword. The third row illustrates an alternative mapping of ECC symbols to the codeword. Many other mappings can be used as will be explained later. The 51-bit codeword is formed as follows.

One of the ECC symbols, say D for illustration, is encoded using a rate 10/11 base code to form four nibbles $y_0$ $y_1$ $y_2$ $y_3$. The unencoded symbols (ABCE) and the base code nibbles are interleaved, with one of the nibbles between each two unencoded symbols in a preferred embodiment. The particular mapping or sequence of this interleaving can vary, as explained later, but one example is shown in the middle row of Table 2 above. The 10-bit symbol D thus is absent from the middle row as that data is reflected in the base code nibbles. Another example of interleaving base code nibbles and unencoded ECC symbols, still within the scope of the invention, is shown for illustration in the bottom row of the table. In this example, ECC symbol E is encoded to form nibbles $z_0$ to $z_3$, $Z_2$ being the two-bit nibble in this case. Other variations in mapping can be used subject to the constraints described below.

In general, it is preferable to divide the base code word into nibbles of roughly equal length. For example, in the preferred embodiment, the nibbles are 3,3,3,2 bits long. One alternative arrangement might be 2,2,2,5 bit nibbles. As noted earlier, if nibble lengths vary, $k_1$ is determined by the two consecutive nibbles whose lengths have the largest sum, including taking into account the concatenation of codewords. Thus for 2,2,2,5 bit nibbles, $k_1=10+7-1=16$. In the 2,2,2,5 bit nibbles example, the number of available codewords=$3^3 * 2^{5-1}$ or $27*31=837$ which is less than the required $2^{10}$ or 1024. In the preferred embodiment, for nibbles 3,3,3,2 bits long, the maximum run length is $10+6-1=15$.

Encoder for the rate 50/51 code

Figure 4:
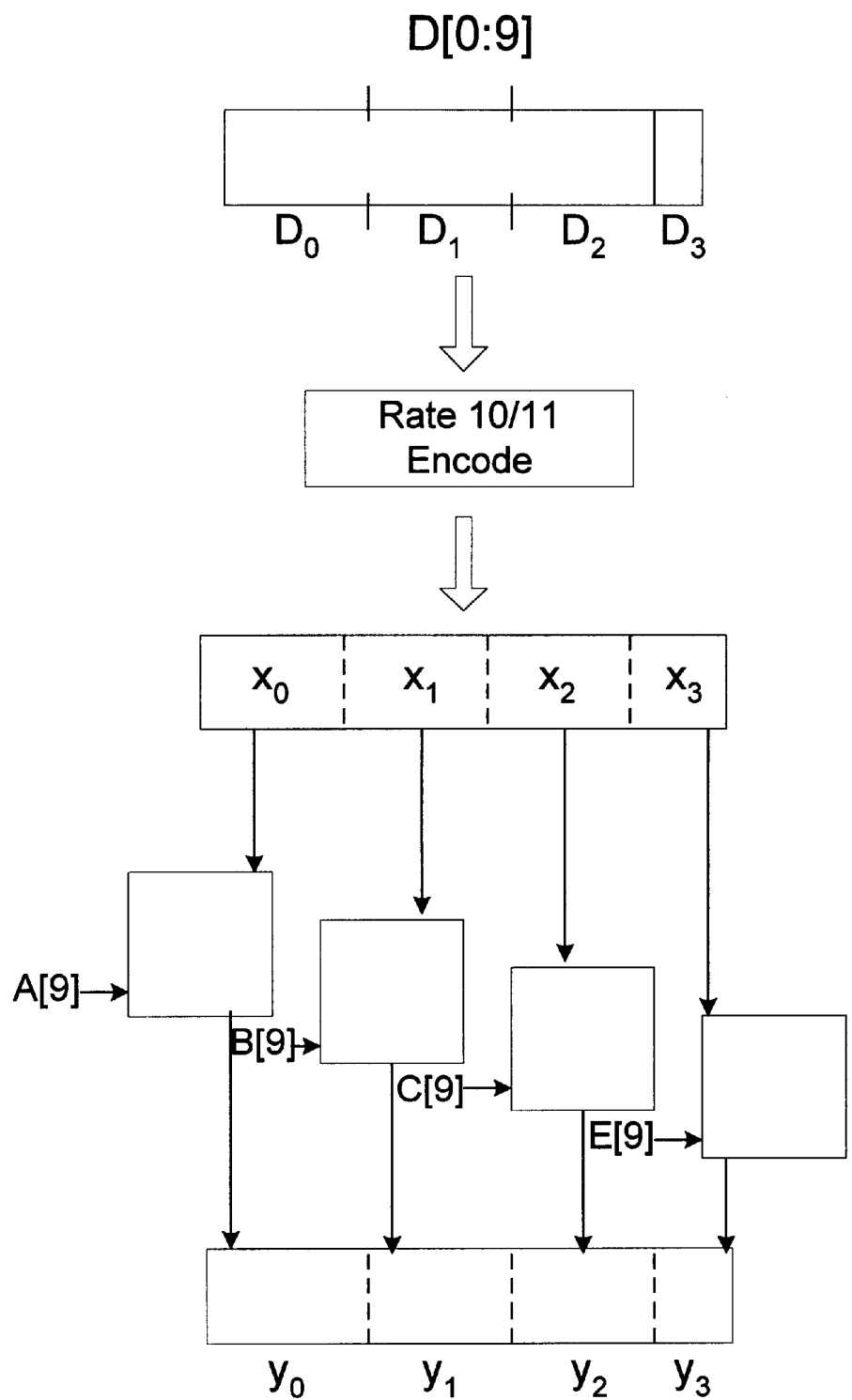
FIG. 4 is a conceptual diagram illustrating a high rate RLL encoding path according to the present invention.

The rate 50/51 encoding is done in several steps: First, receiving a block of input data consisting of a series of five 10-bit ECC symbols; and second, selecting one of the series of input symbols for rate 10/11 encoding, while leaving the four non-selected 10-bit input symbols unencoded. Referring now to FIG. 4, the first step involves separating the 10-bit symbol D[0:9] into four nibbles, $D_0=D[0:2]$, $D_1=D[3:5]$, $D_2=D[6:8]$, $D_3=D[9]$. Next, the encoder determines if any of the 3-bit nibbles are all zero, $f_i=!(D_i[0]+D_i[1]+D_i[2])$, for i=0,1,2, where "!" is the logical NOT operator and "+" denotes the logical OR operation. Based on this information and the value of $D_3$ (=D[9]) the encoder calculates the encoded nibbles $x_0$, $x_1$, $x_2$ (3 bits each) and $x_3$(2 bits) using a selected rate 10/11 base code such as that illustrated in Table 3 below.

The next encoding step enforces the prohibition against all-zeros and all-ones subcode nibbles:

Let A[0:9], B[0:9], C[0:9] and E[0:9] be the uncoded symbols.

If $x_0=111$ and $A[9]=1$, then $y_0=000$, else $y_1=x_0$
If $x_1=111$ and $B[9]=1$, then $y_1=000$, else $y_1=x_1$
If $x_2=111$ and $C[9]=1$, then $y_2=000$, else $y_2=x_2$
If $x_3=11$ and $E[9]=1$, then $y_3=00$, else $y_3=x_3$ This process is illustrated in FIG. 4.

TABLE 3

| 10/11 Base Code Table | | | | | | | |
|---|---|---|---|---|---|---|---|
| $f_0$ | $f_1$ | $f_2$ | $D_3$ | $x_0$ | $x_1$ | $x_2$ | $x_3$ |
| 0 | 0 | 0 | don't care | $D_0$ | $D_1$ | $D_2$ | $D_3$ 1 |
| 0 | 0 | 1 | 1 | 100 | D0 | $D_1$ | 10 |
| 0 | 0 | 1 | 0 | 101 | $D_0$ | $D_1$ | 10 |
| 0 | 1 | 0 | 1 | 010 | $D_0$ | $D_2$ | 10 |
| 0 | 1 | 0 | 0 | 011 | $D_0$ | $D_2$ | 10 |
| 1 | 0 | 0 | 1 | 111 | $D_1$ | $D_2$ | 10 |
| 1 | 0 | 0 | 0 | 001 | $D_1$ | $D_2$ | 10 |

TABLE 3-continued

| 10/11 Base Code Table | | | | | | | |
|---|---|---|---|---|---|---|---|
| $f_0$ | $f_1$ | $f_2$ | $D_3$ | $x_0$ | $x_1$ | $x_2$ | $x_3$ |
| 0 | 1 | 1 | 1 | 110 | $D_0$ | 011 | 10 |
| 0 | 1 | 1 | 0 | 110 | $D_0$ | 010 | 10 |
| 1 | 0 | 1 | 1 | 110 | $D_1$ | 001 | 10 |
| 1 | 0 | 1 | 0 | 110 | $D_1$ | 111 | 10 |
| 1 | 1 | 0 | 1 | 110 | $D_2$ | 100 | 10 |
| 1 | 1 | 0 | 0 | 110 | $D_2$ | 101 | 10 |
| 1 | 1 | 1 | 1 | 110 | 001 | 110 | 10 |
| 1 | 1 | 1 | 0 | 110 | 100 | 110 | 10 |

Other equivalent rate 10/11 codes can be used. The corresponding first decoding step is illustrated in FIG. 5B thus:

First decoding step:
If $y_0=000$, then $x_0=111$, else $x_0=y_0$
If $y_1=000$, then $x_1=111$, else $x_1=y_1$
If $y_2=000$, then $x_2=111$, else $x_2=y_2$
If $y_3=00$, then $x_3=11$, else $x_3=y_3$ Rate 10/11 Subcode Finally, it should be noted that the rate 10/11 base code described herein can itself be used as an RLL code by not interleaving any unencoded symbols. To illustrate, one symbol D can be encoded as shown in the Table above, and then the final encoding step is changed in accordance with the following logic, as shown in FIG. 6:

If $x_0=111$, and $y_3'[1]=1$, then $y_0=000$, else $y_0=x_0$
If $x_1=111$, and $y_0[2]=1$, then $y=000$, else $y_1$ $x_1$
If $x_2=111$, and $y_1[2]=1$, then $y_2=000$, else $y_2=x_2$
If $x_3=11$, and $y_2[2]=1$, then $y_3=00$, else $y_3=x_3$ where $y_3'[1]$ is the last bit of the previous codeword.

If no precoder is used, the maximum number of consecutive zeros is 5. Thus this aspect of the invention provides an RLL (0,k) code with k=4. When a $1/1 \oplus D$ precoder is used, the maximum number of consecutive zeros or ones is 6, thus k=5. With this precoder, the longest Nyquist sequence has a length of 6.

It will be obvious to those having skill in the art that many changes may be made to the details of the above-described embodiment of this invention without departing from the underlying principles thereof. The scope of the present invention should, therefore, be determined only by the following claims.

What is claimed is:

1. A method of encoding an input block of digital data consisting of a series of input symbols of predetermined size, the method comprising the steps of:

selecting a base code having a rate n/n+1 where n is a multiple of the input symbol size;

encoding at least one of the input symbols in accordance with the selected base code so as to produce a base codeword, the number of input symbols thus encoded being equal to a number of input symbols necessary to aggregate n input bits corresponding to the selected base code;

partitioning the base codeword produced by the base code into a plurality of m nibbles, where m is the number of unencoded input symbols;

interleaving the base code nibbles among the unencoded input symbols so as to form a rate p/p+1 codeword, where p=length of the input block; and for each base code nibble in the p/p+1 codeword, if the last bit of the preceding unencoded symbol is a one and the base code nibble is all ones, modifying the base code nibble, thereby limiting a run length of consecutive ones in the resulting codeword.

2. A method according to claim 1 wherein said encoding and partitioning steps further include disallowing any nibble consisting of all zeros.

3. A method according to claim 1 wherein said modifying the base code nibble comprises complementing each bit of the base code nibble, thereby limiting the run length of consecutive ones.

4. A method according to claim 1 wherein selecting the base code comprises selecting a base code having a rate 10/11.

5. A method of encoding an input block of digital data consisting of a series of 10-bit ECC symbols, the method comprising the steps of:
   selecting a base code having a rate n/n+1 where n is a multiple of the 10-bit input symbol size;
   encoding at least one of the input symbols in accordance with the selected base code so as to produce a base codeword, the number of input symbols thus encoded being equal to a number of input symbols necessary to aggregate n input bits corresponding to the selected base code;
   partitioning the base codeword produced by the base code into a plurality of m nibbles, disallowing the all-zeros nibble, where m is the number of unencoded input symbols; and
   interleaving the base code nibbles among the unencoded input symbols so as to form a rate p/p+1 codeword, where p=length of the input block.

6. A method according to claim 5 wherein the input block size is 50 bits, consisting of five 10-bit input symbols.

7. A method according to claim 5 wherein the selected base code has a rate 20/21.

8. A method according to claim 5 wherein the selected base code has a rate 30/31.

9. A method according to claim 5 wherein the base code has rate 10/11 and further comprising, for each base code nibble in the p/p+1 codeword, if the last bit of the preceding unencoded symbol is a one and the base code nibble is all ones, complementing the base code nibble, thereby limiting a run length of consecutive ones in the resulting codeword.

10. A method of rate 50/51 encoding a 50-bit input sequence comprising the steps of:
    receiving a series of five 10-bit input symbols;
    selecting one of the series of input symbols for rate 10/11 encoding;
    leaving the four non-selected 10-bit input symbols unencoded;
    rate 10/11 encoding the selected one of the input symbols so as to form an 11-bit base code word consisting of a series of four nibbles, each nibble containing at least one transition; and
    interleaving the four nibbles between the four unencoded 10-bit input symbols, thereby forming a 51-bit codeword.

11. A method according to claim 10 wherein said selecting step comprises selecting a fourth one of the series of five 10-bit input symbols for the rate 10/11 encoding step.

12. A method according to claim 10 wherein said interleaving step includes:
    inserting a first one of the series of nibbles following the first unencoded 10-bit input symbol;
    inserting a second one of the series of nibbles following the second unencoded 10-bit input symbol;
    inserting a third one of the series of nibbles following the third unencoded 10-bit input symbol; and
    inserting the fourth one of the series of nibbles following the fourth unencoded 10-bit input symbol, wherein the first, second, third and fourth nibbles are arbitrarily selected among the four nibbles of the 11-bit subcode word.

13. A method according to claim 10 wherein said interleaving step includes:
    inserting a first one of the series of nibbles before the first unencoded 10-bit input symbol;
    inserting a second one of the series of nibbles before the second unencoded 10-bit input symbol;
    inserting a third one of the series of nibbles before the third unencoded 10-bit input symbol; and
    inserting the fourth one of the series of nibbles before the fourth unencoded 10-bit input symbol, wherein the first, second, third and fourth nibbles are arbitrarily selected among the four nibbles of the 11-bit subcode word.

14. A method according to claim 10 wherein three of the four nibbles formed by the rate 10/11 encoding step have three bits each, and the fourth one of the four nibbles has two bits.

15. A method according to claim 10 wherein said rate 10/11 encoding step includes:
    first separating the selected 10-bit symbol so as to form a series of four input nibbles defined as $D_0=D[0:2]$, $D_1=D[3:5]$, $D_2=D[6:8]$ and $D_3=D[9]$, where D is the input symbol selected for rate 10/11 encoding;
    calculating a series of four encoded nibbles, $x_0$, $x_1$, $x_2$ and $x_3$ responsive to the four input nibbles, said calculating step including the following:
    for each encoded nibble $x_i$ determined to consist of three ones, if the bit immediately preceding the nibble is a logic one, complementing the said nibble $x_i$ to form a corresponding encoded nibble $y_i$; and
    for each encoded nibble determined not to consist of three ones, forming a corresponding encoded nibble $y_i=x_i$; thereby forming an 11-bit subcode word consisting of encoded nibbles $y_0$ to $y_3$.

16. A method according to claim 15 wherein said calculating step includes encoding the selected 10-bit symbol D according to the following rate 10/11 base code table in which $f_i=!(D_i[0]+D_i[1]+D_i[2])$, for i=0,1,2, where '+' is the logical OR operator and ! is the logical NOT operator:

| 10/11 Base Code Table | | | | | | | |
|---|---|---|---|---|---|---|---|
| $f_0$ | $f_1$ | $f_2$ | $D_3$ | $x_0$ | $x_1$ | $x_2$ | $x_3$ |
| 0 | 0 | 0 | don't care | $D_0$ | $D_1$ | $D_2$ | $D_3$ 1 |
| 0 | 0 | 1 | 1 | 100 | $D_0$ | $D_1$ | 10 |
| 0 | 0 | 1 | 0 | 101 | $D_0$ | $D_1$ | 10 |
| 0 | 1 | 0 | 1 | 010 | $D_0$ | $D_2$ | 10 |
| 0 | 1 | 0 | 0 | 011 | $D_0$ | $D_2$ | 10 |
| 1 | 0 | 0 | 1 | 111 | $D_1$ | $D_2$ | 10 |
| 1 | 0 | 0 | 0 | 001 | $D_1$ | $D_2$ | 10 |
| 0 | 1 | 1 | 1 | 110 | $D_0$ | 011 | 10 |
| 0 | 1 | 1 | 0 | 110 | $D_0$ | 010 | 10 |
| 1 | 0 | 1 | 1 | 110 | $D_1$ | 001 | 10 |
| 1 | 0 | 1 | 0 | 110 | $D_1$ | 111 | 10 |
| 1 | 1 | 0 | 1 | 110 | $D_2$ | 100 | 10 |
| 1 | 1 | 0 | 0 | 110 | $D_2$ | 101 | 10 |
| 1 | 1 | 1 | 1 | 110 | 001 | 110 | 10 |
| 1 | 1 | 1 | 0 | 110 | 100 | 110 | 10. |

17. A method of rate 30/31 encoding a 30-bit input sequence comprising the steps of:
    receiving a series of three 10-bit input symbols;
    selecting one of the series of input symbols for rate 10/11 encoding;
    leaving the two non-selected 10-bit input symbols unencoded;
    rate 10/11 encoding the selected one of the input symbols so as to form an 11-bit subcode word comprising at least two nibbles; and
    interleaving the two nibbles among the two unencoded 10-bit input symbols, thereby forming a 31-bit codeword.

18. A method according to claim 17 wherein the rate 10/11 encoding step includes forming two nibbles consisting of 5 and 6 bits respectively.

19. A method of rate 40/41 encoding a 40-bit input sequence comprising the steps of:

receiving a series of four 10-bit input symbols;

selecting one of the series of input symbols for rate 10/11 encoding;

leaving the three non-selected 10-bit input symbols unencoded;

rate 10/11 encoding the selected one of the input symbols so as to form an 11-bit subcode word comprising at least three nibbles; and interleaving the three nibbles among the three unencoded 10-bit input symbols, thereby forming a 41-bit codeword.

20. A method according to claim 19 wherein the rate 10/11 encoding step includes forming three nibbles consisting of 4,4 and 3 bits respectively.

21. A method of rate 80/81 encoding an 80-bit input sequence comprising the steps of:

receiving a series of eight 10-bit input symbols;

selecting two of the series of input symbols for rate 20/21 encoding;

leaving the six non-selected 10-bit input symbols unencoded;

rate 20/21 encoding the selected two of the input symbols so as to form an 21-bit subcode word comprising at least six nibbles; and interleaving the six nibbles among the six unencoded 10-bit input symbols, thereby forming an 81-bit codeword.

22. A method according to claim 21 wherein the rate 20/21 encoding step includes forming at least six nibbles, at least four of the nibbles consisting of four bits each.

23. A method according to claim 21 wherein the rate 20/21 encoding step includes forming six nibbles, and wherein four of the nibbles consist of four bits each, and the remaining nibbles consist of 2 and 3 bits respectively.

24. A method according to claim 21 wherein said interleaving step consists of arranging the unencoded bytes and the subcode nibbles to form the 81-bit codeword as shown in the following table, in which each letter "A" indicates an arbitrary but unique one of the unencoded bytes and each letter "x" indicates an arbitrary but unique one of the encoded nibbles

| 80/81 codeword arrangement | | | | | | | | | | | |
|---|---|---|---|---|---|---|---|---|---|---|---|
| A | x | A | x | A | x | A | x | A | x | A | x. |

25. A method according to claim 21 wherein said interleaving step consists of arranging the unencoded bytes and the subcode nibbles to form the 81-bit codeword as shown in the following table, in which each letter "A" indicates an arbitrary but unique one of the unencoded bytes and each letter "x" indicates an arbitrary but unique one of the encoded nibbles:

| 80/81 codeword arrangement | | | | | | | | | | | |
|---|---|---|---|---|---|---|---|---|---|---|---|
| x | A | x | A | x | A | x | A | x | A | x | A. |

26. A method of rate 110/111 encoding a 110-bit input sequence comprising the steps of:

receiving a series of eleven 10-bit input symbols;

selecting three of the series of input symbols for rate 30/31 encoding;

leaving the eight non-selected 10-bit input symbols unencoded;

rate 30/31 encoding the selected three of the input symbols so as to form a 31-bit subcode word consisting of a plurality of nibbles; and interleaving the nibbles among the unencoded 10-bit input symbols, thereby forming a 11 I-bit codeword.

27. A method according to claim 26 wherein said interleaving step consists of arranging the unencoded 10-bit input symbols and the subcode nibbles to form the 111-bit codeword as shown in the following table, in which each letter "A" indicates an arbitrary but unique one of the unencoded 10-bit input symbols and each letter "x" indicates an arbitrary but unique one of the encoded nibbles:

| 110/111 codeword arrangement | | | | | | | | | | | | | | |
|---|---|---|---|---|---|---|---|---|---|---|---|---|---|---|
| A | x | A | x | A | x | A | x | A | x | A | x | A | x | A x. |

28. A method according to claim 26 wherein said interleaving step consists of arranging the unencoded 10-bit input symbols and the subcode nibbles to form the 111-bit codeword as shown in the following table, in which each letter "A" indicates an arbitrary but unique one of the unencoded 10-bit input symbols and each letter "x" indicates an arbitrary but unique one of the encoded nibbles:

| 110/111 codeword arrangement | | | | | | | | | | | | | | |
|---|---|---|---|---|---|---|---|---|---|---|---|---|---|---|
| x | A | x | A | x | A | x | A | x | A | x | A | x | A | x A. |

29. A rate 10/11 modulation code for use in a magnetic recording channel to encode a 10-bit symbol D, comprising the characteristics shown in the table below in which $f_i = !(D_i[0] + D_i[1] + D_i[2])$, for i=0,1,2, where '+' is the logical OR operator and ! is the logical NOT operator:

10/11 Base Code Table

| $f_0$ | $f_1$ | $f_2$ | $D_3$ | $x_0$ | $x_1$ | $x_2$ | $x_3$ |
|---|---|---|---|---|---|---|---|
| 0 | 0 | 0 | don't care | $D_0$ | $D_1$ | $D_2$ | $D_3$ 1 |
| 0 | 0 | 1 | 1 | 100 | $D_0$ | $D_1$ | 10 |
| 0 | 0 | 1 | 0 | 101 | $D_0$ | $D_1$ | 10 |
| 0 | 1 | 0 | 1 | 010 | $D_0$ | $D_2$ | 10 |
| 0 | 1 | 0 | 0 | 011 | $D_0$ | $D_2$ | 10 |
| 1 | 0 | 0 | 1 | 111 | $D_1$ | $D_2$ | 10 |
| 1 | 0 | 0 | 0 | 001 | $D_1$ | $D_2$ | 10 |
| 0 | 1 | 1 | 1 | 110 | $D_0$ | 011 | 10 |
| 0 | 1 | 1 | 0 | 110 | $D_0$ | 010 | 10 |
| 1 | 0 | 1 | 1 | 110 | $D_1$ | 001 | 10 |
| 1 | 0 | 1 | 0 | 110 | $D_1$ | 111 | 10 |
| 1 | 1 | 0 | 1 | 110 | $D_2$ | 100 | 10 |
| 1 | 1 | 0 | 0 | 110 | $D_2$ | 101 | 10 |
| 1 | 1 | 1 | 1 | 110 | 001 | 110 | 10 |
| 1 | 1 | 1 | 0 | 110 | 100 | 110 | 10. |

* * * * *

UNITED STATES PATENT AND TRADEMARK OFFICE
CERTIFICATE OF CORRECTION

PATENT NO. : 6,259,384 B1
DATED : July 10, 2001
INVENTOR(S) : McEwen et al.

Page 1 of 1

It is certified that error appears in the above-identified patent and that said Letters Patent is hereby corrected as shown below:

Column 12, claim 26,
Line 34, replace "11 I-bit" with -- 111-bit --.

Signed and Sealed this

Fifth Day of March, 2002

Attest:

JAMES E. ROGAN
*Attesting Officer*    *Director of the United States Patent and Trademark Office*